(12) United States Patent
Guzy et al.

(10) Patent No.: US 7,657,857 B2
(45) Date of Patent: Feb. 2, 2010

(54) PERFORMANCE VISUALIZATION OF DELAY IN CIRCUIT DESIGN

(75) Inventors: Przemek Guzy, Richmond Hill (CA); Steven Caranci, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/101,088

(22) Filed: Apr. 10, 2008

(65) Prior Publication Data

US 2008/0216034 A1 Sep. 4, 2008

Related U.S. Application Data

(62) Division of application No. 11/378,665, filed on Mar. 17, 2006, now abandoned.

(51) Int. Cl.
*G06F 17/50* (2006.01)

(52) U.S. Cl. ............................................. 716/8; 716/10

(58) Field of Classification Search ................ 716/8–10
See application file for complete search history.

(56) References Cited

U.S. PATENT DOCUMENTS

| | | | |
|---|---|---|---|
| 4,918,614 A * | 4/1990 | Modarres et al. | 716/10 |
| 5,850,349 A * | 12/1998 | Hirai et al. | 716/12 |
| 6,493,863 B1 * | 12/2002 | Hamada et al. | 716/18 |
| 6,564,363 B1 * | 5/2003 | Dahl et al. | 716/11 |
| 6,564,364 B1 * | 5/2003 | Dahl et al. | 716/11 |
| 6,671,857 B1 * | 12/2003 | Takahashi et al. | 716/1 |
| 2003/0226129 A1 * | 12/2003 | Nakagawa et al. | 716/11 |
| 2005/0071795 A1 * | 3/2005 | Rushing et al. | 716/11 |
| 2005/0289499 A1 * | 12/2005 | Ogawa et al. | 716/18 |
| 2006/0106847 A1 * | 5/2006 | Eckardt et al. | 707/101 |

* cited by examiner

*Primary Examiner*—Paul Dinh
*Assistant Examiner*—Patrick Sandoval
(74) *Attorney, Agent, or Firm*—Martine Penilla & Gencarella, LLP

(57) ABSTRACT

Methods are provided for presenting delay characteristics of a circuit design. The methods acquire routing delay data and logic delay data for each of a number of paths within the circuit design. In one method, a scatterplot of the routing delay data versus the logic delay data for each of the paths is generated and rendered. In another method, the paths are specified as being associated with modules within the circuit design. In this method, a histogram plot of the paths within each module is generated, wherein the paths within each module are identified as being dominated by routing delay or logic delay. In another embodiment, a connectivity diagram is generated to convey an amount of connectivity within modules and between modules. Each of the methods can be implemented as program instructions on a computer readable medium.

10 Claims, 7 Drawing Sheets

PERFORMANCE VISUALIZATION OF DELAY IN CIRCUIT DESIGN

CLAIM OF PRIORITY

This application is a divisional application of U.S. patent application Ser. No. 11/378,665, filed on Mar. 17, 2006, now abandoned the disclosure of which is incorporated in its entirety herein by reference.

BACKGROUND

Microchips (chips) are often designed using a hardware description language (HDL) specification of the circuitry and associated on-chip circuitry layout. Once specified, the HDL is synthesized into logic blocks that are placed on the chip, e.g., on a field programmable gate array (FPGA). On the chip, the various paths within the circuitry will have an associated delay with respect to signal propagation. The total delay of each path in the circuitry is defined by a logic delay portion and an interconnect delay portion. The design of logic elements within the circuitry affects the logic delay. The placement of logic elements on the chip affects the interconnect delay. Therefore, to adjust the delay of a given path in the circuit, as-defined on the chip, either the logic elements within the path need to be modified or the placement of the logic elements within the path with respect to each other needs to be modified.

When modifying a circuit to resolve timing failures due to excessive delay, the designer needs to be capable of identifying the paths causing the timing failures, and determine the most appropriate manner in which the paths should be modified to correct the associated timing failures. However, it is currently difficult, if not impossible, for a designer to consider a broad view of the circuit design when determining which paths should be modified and how the paths should be modified to resolve timing failures, i.e., whether the logic design of elements within the path should be modified or the placement of elements within the path should be modified.

SUMMARY

In one embodiment, a computer readable medium is disclosed as having program instructions stored thereon for presenting delay characteristics of a circuit design. The program instructions provide for acquiring routing delay data and logic delay data for each of a number of identified paths within the circuit design. The program instructions also provide for generating a scatterplot of the routing delay data versus the logic delay data for each of the number of identified paths within the circuit design. The program instructions further provided for rendering the generated scatterplot in a visual format.

In one version of this embodiment, program instructions are also provided for rendering a total delay acceptance criteria line on the scatterplot. The total delay acceptance criteria line has a slope of minus one and crosses both a routing delay data axis and a logic delay data axis of the scatterplot at a maximum allowable total delay value. Each path plotted above the total delay acceptance criteria line represents a path that does not satisfy the maximum allowable total delay value. In one version of this embodiment, program instructions are also provided for identifying which paths should be modified to reduce corresponding routing delay and which paths should be modified to reduce corresponding logic delay.

In another embodiment, a computer readable medium is disclosed as having program instructions stored thereon for presenting delay characteristics of a circuit design on a module-specific basis. The program instructions provide for acquiring logic delay data and routing delay data for each of a number of paths within specified modules of the circuit design. In one version of this embodiment, the number of paths within the specified modules for which logic and routing delay data is acquired correspond to the paths that have a total delay in excess of a maximum allowable total delay value.

The program instructions also provide for using the acquired logic delay data and routing delay data to identify each of the number of paths as being dominated by either logic delay or routing delay. A path is identified as being dominated by logic delay if logic delay within the path represents more than a threshold percentage of a total delay within the path. A path is identified as being dominated by routing delay if routing delay within the path represents more than the threshold percentage of the total delay within the path.

The program instructions further provide for generating a histogram plot of the number of paths within each of the specified modules, wherein a first portion of the number of paths within each of the specified modules represents the paths dominated by logic delay, and a second portion of the number of paths within each of the specified modules represents the paths dominated by routing delay. In one version of this embodiment, program instructions are also provided for identifying which modules should be modified to reduce corresponding routing delay and which modules should be modified to reduce corresponding logic delay.

In another embodiment, a method is disclosed for placing logic on a chip. The method includes an operation for specifying a circuit design hierarchy level at which connectivity is to be analyzed. An operation is then provided for rendering in a graphical display a geometric shape representing each entity present within the specified circuit design hierarchy level. A size of each geometric shape is defined to represent an amount of connectivity present within the corresponding entity represented by the geometric shape. The amount of connectivity present within the entity corresponds to a number of connections between logic elements within the entity. Also, the size of the geometric shapes relative to each other is representative of an amount of connectivity present within the entities relative to each other, as represented by the geometric shapes.

The method also includes an operation for rendering in the graphical display a number of lines extending between one or more pairs of the geometric shapes. Each line represents connectivity between the entities represented by the pair of geometric shapes associated with the line. In one version of this embodiment, each of the number of lines is rendered as an arrow representing either an output or an input of an entity. An attribute of each line is defined to represent an amount of connectivity present between the entities represented by the pair of geometric shapes associated with the line. Also, the attribute of the lines relative to each other is representative of an amount of connectivity present between entities relative to each other, as represented by other pairs of geometric shapes. In one version of this embodiment, the attribute is a thickness of the line, and the more prominent attribute is a thicker line. In another version of this embodiment, the attribute is a color of the line, and the more prominent attribute is based on a scale of color versus amount of connectivity.

The method further provides an operation for placing entities represented by larger geometric shapes into a respective region of the chip. Additionally, an operation is provided for placing entities represented by a pair of geometric shapes having one or more lines of more prominent attribute extending therebetween in close proximity to each other on the chip. Performance of each operation in the method can be directed by program instructions stored on a computer readable medium.

In another embodiment, a computer implemented system for evaluating delay in a circuit design is disclosed. The system includes a bus, a memory, a display, and a processor. The processor is in communication with the memory and the display through the bus. The processor is operable to receive instructions which, when executed by the processor, cause the processor to perform a method. The method includes an operation for acquiring routing delay data and logic delay data for each of a number of identified paths within the circuit design. The method also includes an operation for generating a scatterplot of the routing delay data versus the logic delay data for each of the number of identified paths within the circuit design. The method further includes an operation for rendering the generated scatterplot in a visual format on the display. In one version of this embodiment, the method can also include an operation for identifying which paths should be modified to reduce corresponding routing delay and which paths should be modified to reduce corresponding logic delay, such that a maximum allowable total delay value is satisfied.

In another version of this embodiment, the method can include operations for generating a histogram plot of path delay characteristics within each of a number of specified modules of the circuit design, wherein the number of identified paths are within the specified modules of the circuit design. The method includes an operation for using the acquired logic delay data and routing delay data to identify each of the number of paths as being dominated by either logic delay or routing delay. The method also includes generating a histogram plot of the number of paths within each of the specified modules, wherein a first portion of the number of paths within each of the specified modules represents the paths dominated by logic delay, and a second portion of the number of paths within each of the specified modules represents the paths dominated by routing delay. The method can further include an operation for identifying which modules should be modified to reduce corresponding routing delay and which modules should be modified to reduce corresponding logic delay, such that a maximum allowable total delay value is satisfied.

In the various embodiments of the present invention, each path represents a register-to-register connection traversing through one or more logic elements. The routing delay data represents delay associated with propagating signals between logic elements. The logic delay data represents delay associated with obtaining an output signal from a logic element based on receipt of one or more input signals. Additionally, the routing delay data and the logic delay data can be acquired from a timing analysis of the circuit design performed using programmable logic device design software.

Other aspects and advantages of the invention will become more apparent from the following detailed description, taken in conjunction with the accompanying drawings, illustrating by way of example the present invention.

DETAILED DESCRIPTION

Figure 1:
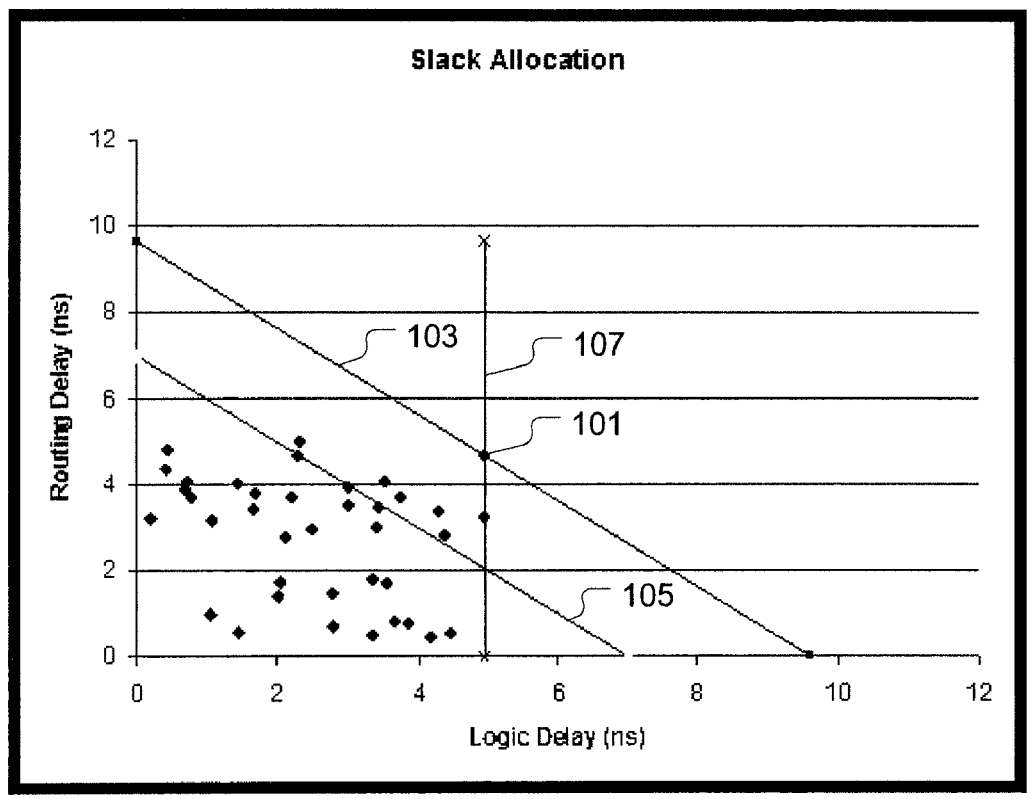
FIG. 1 is an illustration showing a scatterplot of routing delay versus logic delay in a circuit design, in accordance with one embodiment of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

When designing a circuit or system of circuits, such as to be implemented on a programmable logic device (PLD), a designer is generally required to ensure that the circuit satisfies some specified timing requirements. More specifically, the designer may be required to ensure that each path within the circuit has an associated total delay that does not exceed a specified maximum allowable delay value. It should be understood that each path within the circuit represents a register-to-register connection traversing through one or more logic elements. The total delay associated with each path within the circuit includes both routing delay and logic delay. The routing delay represents delay associated with propagating signals between logic elements. The logic delay represents delay associated with obtaining an output signal from a logic element based on receipt of one or more input signals.

In addressing circuit timing requirements, the circuit designer needs to identify the paths within the circuit that do not satisfy the specified maximum allowable delay value. The circuit designer also need to evaluate whether the timing expectations as represented by the maximum allowable total delay value are reasonable, i.e., feasible to satisfy considering the characteristics of the circuit design. Considering that the specified timing requirements are reasonable, the circuit designer is tasked with determining how the circuit should be modified such that each path satisfies the maximum allowable total delay value.

One way to adjust circuit timing performance is to modify a floorplan of the circuit on the chip. For example, path delay may be reduced by placing certain components of the circuit that are highly interconnected in closer proximity to each other on the chip. Another way to adjust circuit timing performance is to modify the logic design of a given component of the circuit to reduce delay within paths of the given component. Thus, the designer needs to determine whether it is most appropriate to modify the placement of circuit components or the logic design of circuit components to ensure that the total delay within each path satisfies the maximum allowable delay value specified for the circuit.

The present invention provides a set of visualization tools that assist the circuit designer by identifying which paths in the circuit design do not satisfy timing requirements and by indicating how the circuit design should be modified to resolve timing requirement failures. The visualization tools enable the designer to quickly recognize which parts of the circuit design should be modified with respect to logic design and which parts of the circuit designer should have their placement on the chip modified. As discussed further below, the visualization tools enable the most relevant information regarding critical paths, i.e., paths that are more likely to not satisfy timing requirements, to be presented in a manner which highlights the timing problems as being either logic design driven or interconnect driven. Additionally, the visualization tools enable the information regarding critical paths to be organized by design compilation hierarchy, such that timing performance for selected modules or components within the design can be examined, wherein the selected modules or components can reside at any level within the design. By having the most relevant information regarding critical paths presented in a manner which highlights the timing problems, the designer can make circuit design changes which are more effective.

FIG. 1 is an illustration showing a scatterplot of routing delay versus logic delay in a circuit design, in accordance with one embodiment of the present invention. The scatterplot of FIG. 1 can also be referred to as a slack allocation graph. In the scatterplot, each plotted point represents a path in a user defined set of paths for which timing is to be evaluated. In one embodiment, the user defined set of paths includes critical paths that are more likely to not satisfy timing requirements. It should be appreciated that a typical circuit may include hundreds of thousands of paths. In one embodiment, only the top percentage, e.g., 10%, of paths with respect to total delay will be represented in the scatterplot. However, in other embodiments, any number paths in the circuit design can be represented in the scatterplot.

In one embodiment, logic delay is represented on a horizontal axis and routing delay is represented on a vertical axis. In another embodiment, routing delay is represented on the horizontal axis and logic delay is represented on the vertical axis. Regardless of the particular embodiment, a position of each point in the scatterplot is determined based on the routing delay value and logic delay value of the corresponding path. It should be understood that a total delay of each path is defined as the sum of the routing delay and logic delay of the path. As previously mentioned, the routing delay represents delay associated with propagating signals between logic elements and can include effects due to clock skew, setup, etc. The logic delay represents delay associated with obtaining an output signal from a logic element based on receipt of one or more input signals. In one embodiment, the routing delay data and logic delay data for each path is acquired from a timing analysis of the circuit design performed using programmable logic device design software, such as the Quartus II™ software available from Altera Corporation.

A path having the largest total delay is represented by a point 101 in the scatterplot. A line 103 having a slope of minus one is drawn through point 101, such that the line 103 intersects the routing delay and logic delay axes at the same value. The value at which the line 103 intersects the routing delay axis or logic delay axis represents the largest total single path delay. Each point on the line 103 represents a total delay equivalent to the largest total single path delay. Points representing all other paths in the scatterplot should fall on or below line 103. Therefore, considering that the most critical paths with respect to timing are represented in the scatterplot, the line 103 represents the limiting delay within the circuit design.

Another line 105 having a slope of minus one is shown on the scatterplot to represent the timing requirement of the circuit in terms of total delay per path. The value at which the line 105 intersects the routing delay axis or logic delay axis represents the maximum allowable total delay value per path. Each point on the line 105 represents the maximum allowable total delay value per path. Paths represented by points above the line 105 are failing paths with respect to satisfying the maximum allowable total delay value.

A vertical line 107 is also shown as passing through the point farthest to the right in the scatterplot. The line 107 represents the logic-driven delay limitation of the circuit design. More specifically, if the routing delay within each path was assumed to be zero (which is not actually possible) the largest total delay (logic delay only in this case) within the circuit is indicated by line 107. Therefore, line 107 serves to provide the designer with an indication of the reasonableness of the specified timing requirements of the circuit, given the logic design of the circuit.

Modifying the placement of circuitry on the chip, i.e., the floorplan of the circuit on the chip, serves to either increase or decrease the routing delay of each path in the circuit. Thus, with respect to the scatterplot of FIG. 1, modifying the placement of circuitry on the chip causes the points to move either up or down. Paths that may have their total delay reduced more easily by placement constraints are represented by points toward the left side of the scatterplot. In the scatterplot of FIG. 1, the most critical path (point 101) has a routing delay of about 4.4 nanoseconds (ns). To satisfy timing requirements, the most critical path (point 101) needs to move below line 105. If the delay of the most critical path (point 101) is to be reduced through on-chip placement constraints only, the routing delay of the most critical path (point 101) would have to be reduced to at least about 2 ns, which is a reduction of more than one-half is current routing delay value. It may be difficult to achieve of one-half reduction in routing delay through application of on-chip placement constraints. Therefore, the designer may consider reducing the total delay of the most critical path (point 101) through reduction of associated logic delay or a combination of reduction in both logic delay and routing delay.

Modifying the logic design of the circuit serves to either increase or decrease the logic delay of each path in the circuit. Thus, with respect to the scatterplot of FIG. 1, modifying the logic design of the circuit causes the points to move either left or right. Paths represented by points toward the right side of the scatterplot have a substantial logic delay component. In the scatterplot of FIG. 1, the most critical path (point 101) has a logic delay of about 4.7 ns. Modifying the design to add a pipeline stage in the most critical path (point 101) may significantly reduce the logic delay and move the point 101 to the left until it is below the line 105.

It should be appreciated that by understanding how logic design changes and on-chip placement changes will affect the paths in the circuit design, i.e., the points in the scatterplot, the designer can determine which changes are feasible and more likely to be effective with respect to satisfying timing requirements. Thus, by examining the scatterplot, the designer can determine whether on-chip placement or logic design of the circuit should be modified to achieve the required timing performance in a given path.

Additionally, examination of the position of the failing path points in the scatterplot relative to the timing requirement line 105 enables the designer to determine how realistic the specified timing requirement is given the logic design of the circuit. For example, if there is a small number of failing paths that are dominated by routing delay and most other paths easily satisfy the timing requirement, it is likely that modification of the on-chip circuit placement will be capable of correcting the timing failures without creating new timing failures. However, if many paths are failing or near failing with respect to the timing requirement as indicated by line 105, it is likely that either modification of the circuit logic design is required to correct the timing failures or the timing requirement is not a realistic expectation for the particular circuit.

Figure 2:
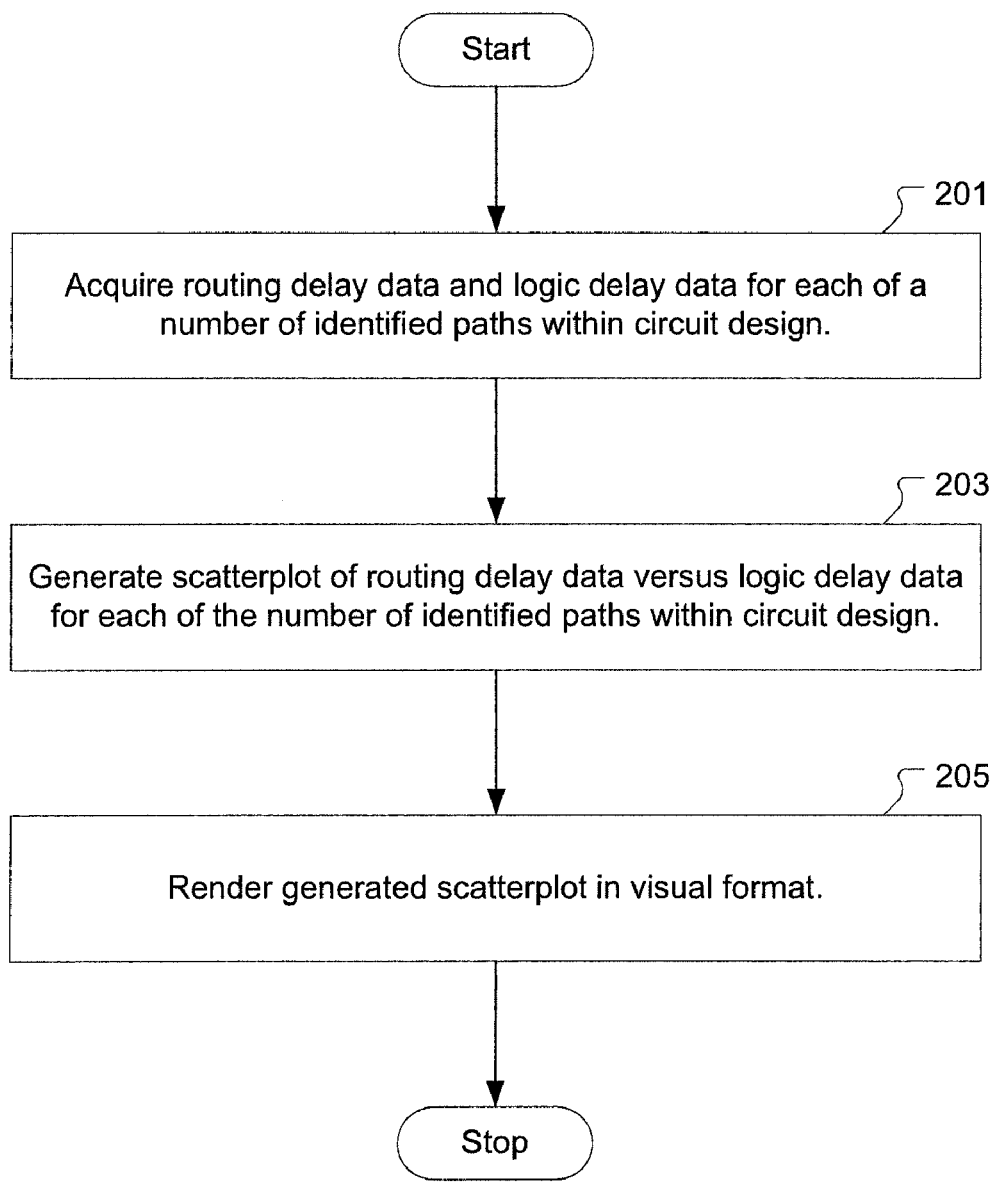
FIG. 2 is an illustration showing a flowchart of a method for presenting delay characteristics of a circuit design, in accordance with one embodiment of the present invention.

FIG. 2 is an illustration showing a flowchart of a method for presenting delay characteristics of a circuit design, in accordance with one embodiment of the present invention. It should be understood that each of the method operations described with respect to FIG. 2 can be implemented as program instructions stored on a computer readable medium. In one embodiment, program instructions for presenting delay characteristics of the circuit design in accordance with the method of FIG. 2 can be implemented as a portion of program instructions defining programmable logic device (PLD) design software.

The method includes an operation 201 for acquiring routing delay data and logic delay data for each of a number of identified paths within the circuit design. In one embodiment, the routing delay data and the logic delay data are acquired from a timing analysis of the circuit design performed using PLD design software. Also, in one embodiment the method can include an operation for receiving a user input specifying the number of identified paths within the circuit design to be considered. In one embodiment, the number of identified paths to be considered include the paths that are likely to have a total delay that exceeds a total delay acceptance criterion, such as a maximum allowable total delay value.

The method further includes an operation 203 for generating a scatterplot of the routing delay data versus the logic delay data for each of the number of identified paths within the circuit design. Also, in an operation 205, the generated scatterplot is rendered in a visual format. In one embodiment, the method can further include an operation for rendering a total delay acceptance criteria line on the scatterplot. The total delay acceptance criteria line has a slope of minus one and crosses both the routing delay data axis and the logic delay data axis of the scatterplot at a maximum allowable total delay value. Each point plotted above the total delay acceptance criteria line represents a path that does not satisfy the maximum allowable total delay value. The method can also include an operation for identifying which paths should be modified to reduce corresponding routing delay and which paths should be modified to reduce corresponding logic delay.

Figure 3:
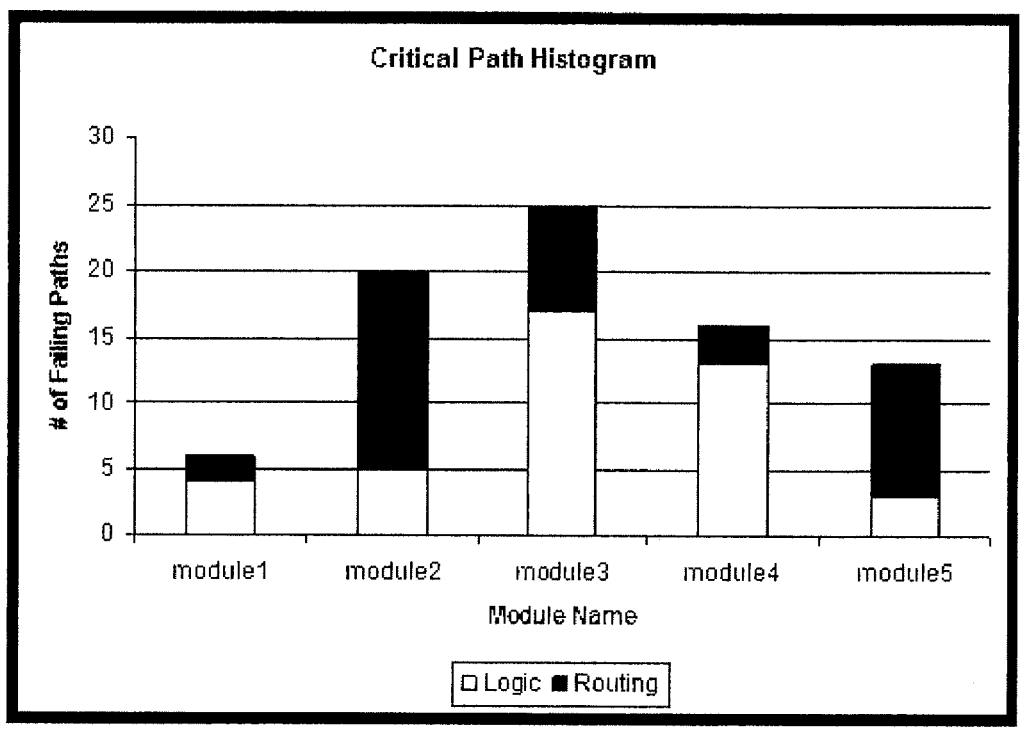
FIG. 3 is an illustration showing a histogram plot of critical paths within specified modules in a circuit design, in accordance with one embodiment of the present invention.

FIG. 3 is an illustration showing a histogram plot of critical paths within specified modules in a circuit design, in accordance with one embodiment of the present invention. The histogram plot provides a visualization of the logic delay versus routing delay on a module-specific basis within the circuit design. It should be appreciated that circuits can be designed/compiled in a hierarchical manner, wherein higher-level entities within the circuit hierarchy can include instances of lower-level entities within the circuit hierarchy. Thus, in the circuit design, instances of circuit entities can be nested to create modules, wherein a module is defined as a conglomeration of circuitry that accepts specific inputs and performs a particular function to generate specific outputs. It should be appreciated that modules can exist at different levels within the circuit design hierarchy. Each instance of a given entity/module within the circuit design is assigned a unique identifier. In the histogram plot, the identifier for each of a number of selected modules is presented on one axis, e.g., the horizontal axis in FIG. 3, and a number of failing paths within each of the selected modules is rendered against a scale defined on another axis, e.g., the vertical axis in FIG. 3.

The number of failing paths within each of the selected modules is determined through evaluation of each path in the circuitry that defines the particular module. In one embodiment, each module depicted in the histogram resides at a specified level within the circuit design hierarchy. The number of failing paths depicted for each module is identified in two portions, wherein a first portion represents the number of failing paths that are dominated by logic delay, and a second portion represents the number of failing paths that are dominated by routing delay. If within a particular path the routing delay exceeds a threshold percentage, e.g., 50%, of the total delay, the particular path is classified as being dominated by routing delay. Similarly, if within a particular path the logic delay exceeds a threshold percentage, e.g., 50%, of the total delay, the particular path is classified as being dominated by logic delay. By examining the histogram, the circuit designer can determine whether timing requirement failure of a particular module is caused primarily by logic delay or routing delay. Thus, with the benefit of the histogram, the circuit designer can determine whether modification of the logic design of a module or the on-chip placement of a module is more likely to result in satisfaction of timing requirements.

With respect to FIG. 3, the circuit designer will see that modules 1, 4, and 3 are failing the timing requirements primarily due to logic delay as opposed to routing delay. Thus, through the benefit of the histogram, the designer will be made aware that modification of the logic design of modules 1, 4, and 3 should be strongly considered. The circuit designer will also see that modules 2 and 5 are failing the timing requirements primarily due to routing delay as opposed to logic delay. Thus, through the benefit of the histogram, the designer should recognize that the timing performance of modules 2 and 5 can be improved by optimizing the on-chip placement of modules 2 and 5.

In various embodiments, the designer can apply various filters to the data rendered in the histogram. For example, the designer may be interested in both failing paths and paths that have a total delay within a specified proximity to the timing requirement. In another example, the designer may specify a threshold for defining whether a path is failing because of logic delay or routing delay. For instance, the designer may establish that any path having a routing delay that exceeds a threshold percentage of the total delay should be considered as failing due to routing delay. Alternatively, the designer may establish that any path having a logic delay that exceeds a threshold percentage of the total delay should be considered as failing due to logic delay.

Figure 4:
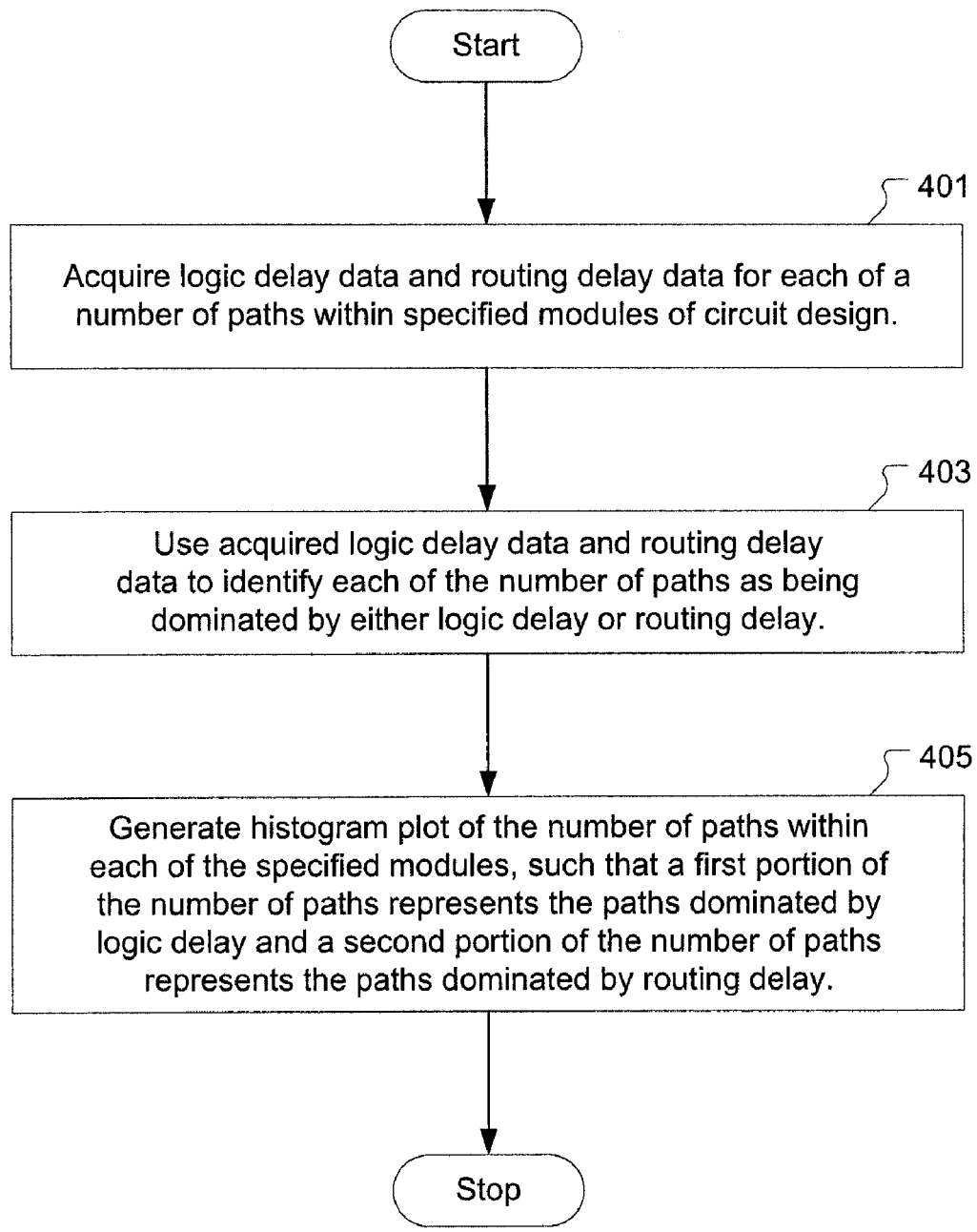
FIG. 4 is an illustration showing a flowchart of a method for presenting delay characteristics of a circuit design on a module-specific basis, in accordance with one embodiment of the present invention.

FIG. 4 is an illustration showing a flowchart of a method for presenting delay characteristics of a circuit design on a module-specific basis, in accordance with one embodiment of the present invention. It should be understood that each of the method operations described with respect to FIG. 4 can be implemented as program instructions stored on a computer readable medium. In one embodiment, program instructions for presenting delay characteristics of the circuit design on a module-specific basis in accordance with the method of FIG. 4 can be implemented as a portion of program instructions defining PLD design software.

The method includes an operation 401 for acquiring logic delay data and routing delay data for each of a number of paths within specified modules of the circuit design. In one embodiment, the routing delay data and the logic delay data are acquired from a timing analysis of the circuit design performed using PLD design software. Also, in one embodiment the method can include an operation for receiving a user input specifying the modules within the circuit design to be considered. In one embodiment, the number of paths within the specified modules correspond to the paths that have a total delay in excess of a maximum allowable total delay value.

The method also includes an operation 403 for using the acquired logic delay data and routing delay data to identify each of the number of paths as being dominated by either logic delay or routing delay. In one embodiment, a path is identified as being dominated by logic delay if logic delay within the path represents more than a threshold percentage of a total delay within the path. Also, the path is identified as being dominated by routing delay if routing delay within the path represents more than the threshold percentage of the total delay within the path. In one embodiment, the threshold percentage is fifty-percent, i.e., representing one-half of the total delay within the path.

The method further includes an operation 405 for generating a histogram plot of the number of paths within each of the specified modules. In the histogram plot, a first portion of the number of paths within each of the specified modules represents the paths dominated by logic delay. Also in the histogram plot, a second portion of the number of paths within each of the specified modules represents the paths dominated by routing delay. In one embodiment, the method can also include an operation for identifying which modules should be modified to reduce corresponding routing delay and which modules should be modified to reduce corresponding logic delay.

The present invention further provides a connectivity diagram for a circuit design as another performance visualization tool. The connectivity diagram indicates how much connectivity is present within various groups of logic in the circuit design and how much connectivity is present between various groups of logic in the circuit design. The circuit designer can user the connectivity view provided by the connectivity diagram as input when determining how logic should be grouped together on the chip and which groups of logic should be placed in closer proximity to each other on the chip.

The connectivity diagram is associated with a particular user-selected level within the circuit design hierarchy. Thus, the entities/modules defined at the particular user-selected level within the circuit design hierarchy will be represented in the connectivity diagram. More specifically, each entity/module will be represented as a geometric shape within the connectivity diagram. A size of each geometric shape is established based on an amount of connectivity between logic elements present within the entity/module associated with the geometric shape. The size of each geometric shape is established based on a common scale of connectivity. Therefore, the size of one geometric shape relative to another is an indication of the amount of connectivity within one entity/module relative to another. In one embodiment, an entity/module represented by a larger geometric shape has more internal connectivity than an entity/module represented by a smaller geometric shape. It should be appreciated that the particular geometric shape used in the connectivity diagram is arbitrary. In one embodiment, circles are used as the geometric shapes.

Also within the connectivity diagram, lines are drawn between pairs of geometric shapes to indicate connectivity between the entities/modules represented by the pair of geometric shapes. An attribute of the line is used to represent an amount of connectivity between the entities/modules represented by the geometric shapes to which the line is connected. For example, thicker lines can be used to represent more connectivity than thinner lines. The attribute of each line is established based on a common scale of connectivity. Therefore, the attribute of one line relative to another is an indication of the amount of connectivity between one pair of entities/modules relative to another pair.

Figure 5:
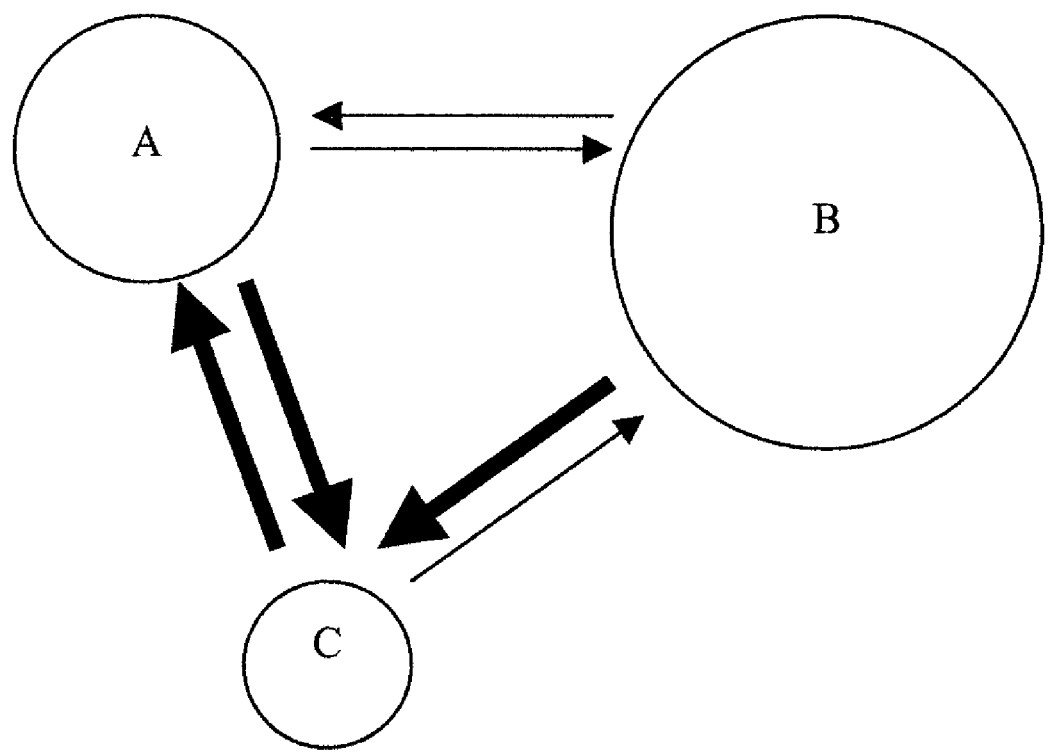
FIG. 5 is an illustration showing an example connectivity diagram for a circuit design, in accordance with one embodiment of the present invention.

FIG. 5 is an illustration showing an example connectivity diagram for a circuit design, in accordance with one embodiment of the present invention. Three modules (A, B, and C) are shown to exist at the selected circuit design hierarchy level depicted in the exemplary connectivity diagram. Due to the size of the circle associated with module B, the designer can recognize that there is a larger amount of internal connectivity between the logic elements that make up module B, as compared to the internal connectivity between the logic elements that make up either module A or module C. The designer can also gauge that module C has the least amount of internal connectivity. Additionally, by examining the thickness of the lines connecting the various modules, the designer can recognize that there is less connectivity present between modules A and B relative to the connectivity present between modules A and C. Also, the designer can recognize that when considering module B relative to module C, there is more output connectivity than input connectivity.

Using the connectivity diagram, the designer can create an on-chip floorplan for the circuit that groups modules having larger internal connectivity into their own regions. For example, with reference to FIG. 5, the designer would consider placing the various logic elements that form module B into a common region of the chip. Also, using the connectivity diagram, the designer can create the on-chip floorplan such that modules which are more strongly connected are placed in closer proximity to one another. For example, with reference to FIG. 5, the designer would consider placing the logic of module A in closer proximity to the logic of module C.

It should be understood that the circuit design hierarchy level represented in the connectivity diagram corresponds to a depth-of-view within the circuit design. In one embodiment, this depth-of-view is a user-selectable input when rendering the connectivity diagram. For example, the designer may view connectivity diagrams of a circuit design at successively lower levels until some meaningful connectivity information can be extracted to support development of the on-chip floorplan. Additionally, it should be understood that the connectivity diagram is a representation of the circuit design and can be generated based on a netlist without having performed a timing analysis of the circuit.

Figure 6:
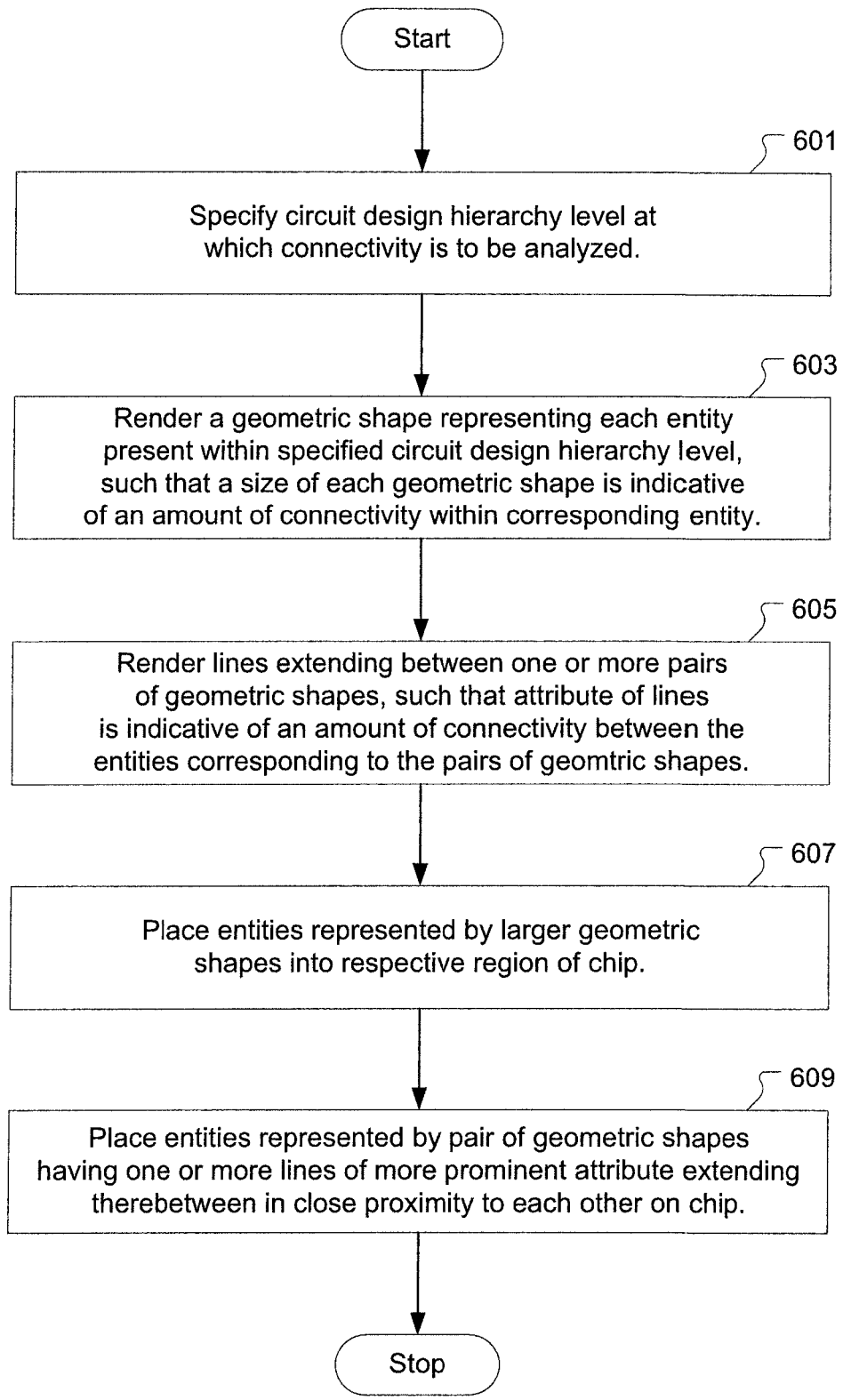
FIG. 6 is an illustration showing a flowchart of a method for placing logic on a chip, in accordance with one embodiment of the present invention.

FIG. 6 is an illustration showing a flowchart of a method for placing logic on a chip, in accordance with one embodiment of the present invention. It should be understood that each of the method operations described with respect to FIG. 6 can be implemented as program instructions stored on a computer readable medium. The method includes an operation 601 for specifying a circuit design hierarchy level at which connectivity is to be analyzed. In one embodiment, an operation is provided for receiving a user input specifying the circuit design hierarchy level at which connectivity is to be analyzed.

The method also includes an operation 603 for rendering in a graphical display a geometric shape representing each entity present within the specified circuit design hierarchy level. A size of each geometric shape is defined to represent an amount of connectivity present within the corresponding entity represented by the geometric shape, relative to an amount of connectivity present within the entities represented by other geometric shapes. It should be understood that the amount of connectivity present within the entity corresponds to a number of connections between logic elements within the entity.

In an operation 605, a number of lines extending between one or more pairs of the geometric shapes are rendered in the graphical display. Each rendered line represents connectivity between the entities represented by the pair of geometric shapes associated with the line. An attribute of each rendered line is defined to represent an amount of connectivity present between the entities represented by the pair of geometric shapes associated with the rendered line. In one embodiment, the attribute is a thickness of the line, and the more prominent attribute is a thicker line. In another embodiment, the attribute is a color of the line, and the more prominent attribute is based on a scale of color versus amount of connectivity. It should be appreciated that other line attributes can also be used to indicate the amount of connectivity. In one embodiment, each of the lines is rendered as an arrow representing either an output or an input of an entity.

The method also includes an operation 607 for placing entities represented by larger geometric shapes into a respective region of the chip. Thus, logic elements within the entities represented by larger geometric shapes will be positioned in close proximity to each other when defining the on-chip floorplan of the circuit. The method further includes an operation 609 for placing entities represented by a pair of geometric shapes having one or more lines of more prominent attribute extending therebetween in close proximity to each other on the chip.

It should be appreciated that in each of the visualization tools described herein, the user is capable of limiting the paths that are shown or considered. This limitation of paths can be implemented using many different criteria. For example, the paths can be limited based on the number of logic levels between registers within each path. Also, the paths can be limited based on the maximum/minimum fan-in/fan-out within each path. Paths can be limited by specifying source and/or destination wildcards or resource type. It should be understood that paths can be limited by essentially any parameter available to describe a path. Additionally, each of the visualization tools described herein can be made to operate dependently or independently. For example, selecting a set of paths in one tool can automatically display that set of paths in the other tools.

Figure 7:
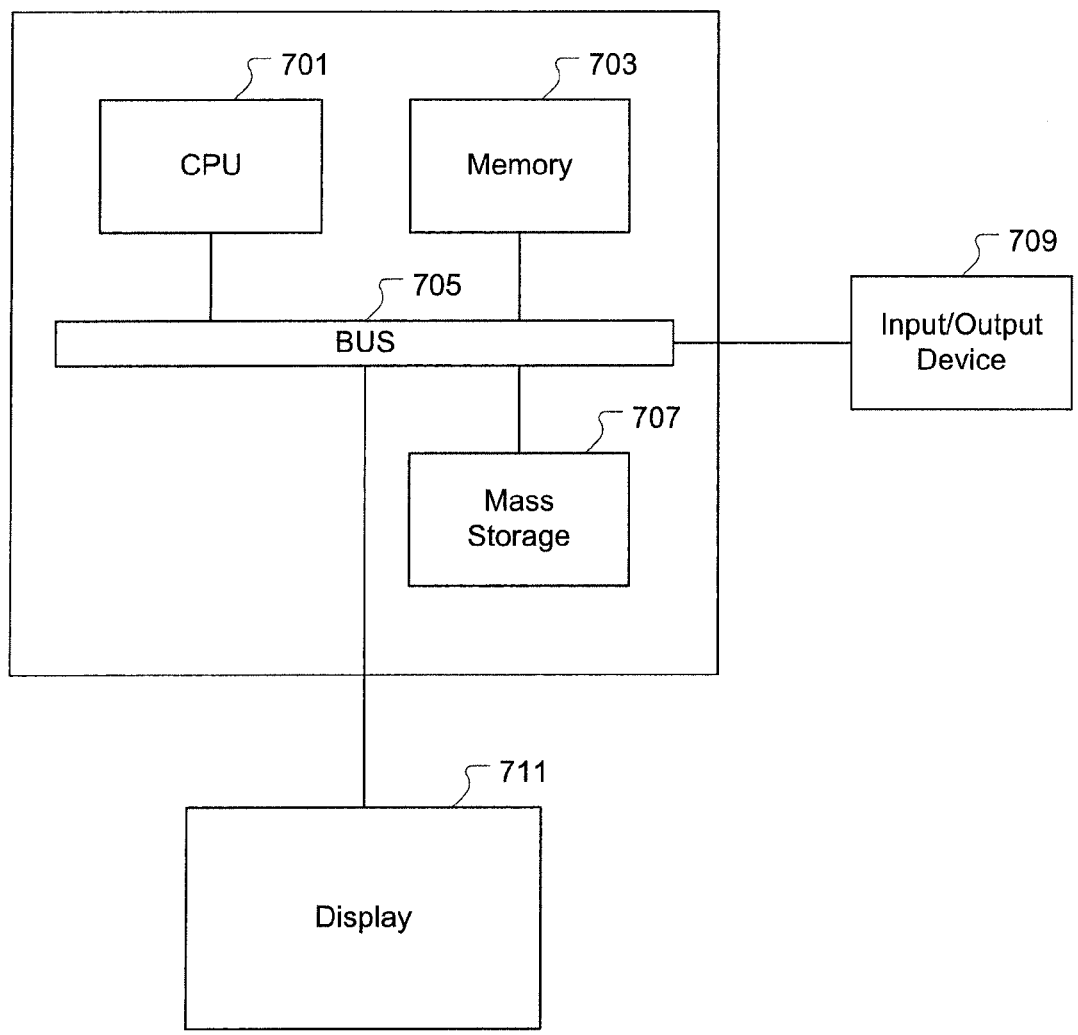
FIG. 7 is an illustration showing a exemplary computer system for evaluating delay in a circuit design, which may implement embodiments of the present invention.

It should be appreciated that the methods described herein may be performed with a digital processing system, such as a conventional, general-purpose computer system. Special purpose computers, which are designed or programmed to perform only one function may be used in the alternative. FIG. 7 is an illustration showing a exemplary computer system for evaluating delay in a circuit design, which may implement embodiments of the present invention. The computer system of FIG. 7 may be used to perform embodiments of the present invention in conjunction with synthesis of a design that is described in a hardware description language (HDL). The computer system includes a central processing unit (CPU) 701, which is coupled through a bus 705 to a memory 703, and mass storage device 707. Mass storage device 707 represents a persistent data storage device such as a floppy disc drive or a fixed disc drive, which may be local or remote. It should be appreciated that CPU 701 may be embodied in a general-purpose processor, a special purpose processor, or a specially programmed logic device.

Display 711 is in communication with CPU 701, memory 703, and mass storage device 707, through bus 705. Of course, display 711 is configured to display the visualization tools described herein. Input/output device 709 is coupled to bus 705 in order to communicate information in command selections to CPU 701. It should be appreciated that data to and from external devices may be communicated through the input/output device 709. CPU 701 can be defined to execute the functionality described herein to enable optimization of circuit design through modification of on-chip floorplan and/or logic design, such that timing performance requirements of the circuit are satisfied.

Methods for generating and using the circuit timing performance visualization tools described herein may be applied to the design of a programmable logic device. The programmable logic device may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any other suitable application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for generating a connectivity diagram for a circuit design, comprising:

specifying a circuit design hierarchy level at which electrical connectivity is to be analyzed;

operating a computer system to visually render in a graphical display a geometric shape representing each entity present within the specified circuit design hierarchy level, a size of each geometric shape being defined to represent an amount of electrical connectivity present within the corresponding entity represented by the geometric shape relative to an amount of electrical connectivity present within the entities represented by other geometric shapes, wherein a shape and the size of a given geometric shape does not correspond to an actual shape and an actual size of a given entity represented by the given geometric shape, wherein the visual rendering of geometric shapes by the computer system is performed automatically based on analysis by the computer system of electrical connectivity within the specified circuit design hierarchy level;

operating a computer system to visually render in the graphical display a number of lines extending between one or more pairs of the geometric shapes, each line representing electrical connectivity between the entities represented by the pair of geometric shapes associated with the line, wherein an attribute of each line is defined to represent an amount of electrical connectivity present between the entities represented by the pair of geometric shapes relative to an amount of electrical connectivity present between entities represented by other pairs of geometric shapes, wherein the visual rendering of the number of lines by the computer system is performed automatically based on analysis by the computer system of electrical connectivity between entities represented by the one or more pairs of geometric shapes, wherein the connectivity diagram is an abstraction of the circuit design and is not a layout of a chip.

2. A method for generating a connectivity diagram for a circuit design as recited in claim 1, wherein the amount of electrical connectivity present within the entity corresponds to a number of electrical connections between circuit elements within the entity.

3. A method for generating a connectivity diagram for a circuit design as recited in claim 1, wherein each of the number of lines is visually rendered as an arrow representing either an output or an input of an entity.

4. A method for generating a connectivity diagram for a circuit design as recited in claim 1, wherein the attribute is a thickness of the line and the more prominent attribute is a thicker line.

5. A method for generating a connectivity diagram for a circuit design as recited in claim 1, wherein the attribute is a color of the line and the more prominent attribute is based on a scale of color versus amount of electrical connectivity.

6. A computer readable storage medium having program instructions stored thereon for generating a connectivity diagram for a circuit design, comprising:

program instructions for allowing specification of a circuit design hierarchy level at which electrical connectivity is to be analyzed;

program instructions for operating a computer system to visually render in a graphical display a geometric shape representing each entity present within the specified circuit design hierarchy level, a size of each geometric shape being defined to represent an amount of electrical connectivity present within the corresponding entity represented by the geometric shape relative to an amount of electrical connectivity present within the entities represented by other geometric shapes, wherein a shape and the size of a given geometric shape does not correspond to an actual shape and an actual size of a given entity represented by the given geometric shape, wherein the visual rendering of geometric shapes by the computer system is performed automatically based on analysis by the computer system of electrical connectivity within the specified circuit design hierarchy level;

program instructions for operating a computer system to visually render in the graphical display a number of lines extending between one or more pairs of the geometric shapes, each line representing electrical connectivity between the entities represented by the pair of geometric shapes associated with the line, wherein an attribute of each line is defined to represent an amount of electrical connectivity present between the entities represented by the pair of geometric shapes relative to an amount of electrical connectivity present between entities represented by other pairs of geometric shapes, wherein the visual rendering of the number of lines by the computer system is performed automatically based on analysis by the computer system of electrical connectivity between entities represented by the one or more pairs of geometric shapes, wherein the connectivity diagram is an abstraction of the circuit design and is not a layout of a chip.

7. A computer readable storage medium having program instructions stored thereon for generating a connectivity diagram for a circuit design as recited in claim 6, wherein the amount of electrical connectivity present within the entity corresponds to a number of electrical connections between circuit elements within the entity.

8. A computer readable storage medium having program instructions stored thereon for generating a connectivity diagram for a circuit design as recited in claim 6, wherein each of the number of lines is visually rendered as an arrow representing either an output or an input of an entity.

9. A computer readable storage medium having program instructions stored thereon for generating a connectivity diagram for a circuit design as recited in claim 6, wherein the attribute is a thickness of the line and the more prominent attribute is a thicker line.

10. A computer readable storage medium having program instructions stored thereon for generating a connectivity diagram for a circuit design as recited in claim 6, wherein the attribute is a color of the line and the more prominent attribute is based on a scale of color versus amount of electrical connectivity.

* * * * *